United States Patent
Lee

(10) Patent No.: US 7,289,592 B2
(45) Date of Patent: Oct. 30, 2007

(54) APPARATUS FOR MULTIPLE-DIVISOR PRESCALER

(75) Inventor: Ching-Feng Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 31 days.

(21) Appl. No.: 11/419,762

(22) Filed: May 23, 2006

(65) Prior Publication Data

US 2007/0223647 A1    Sep. 27, 2007

(30) Foreign Application Priority Data

Mar. 21, 2006    (TW) .............................. 95109624 A

(51) Int. Cl.
*H03K 21/00* (2006.01)
*H03B 19/00* (2006.01)
(52) U.S. Cl. ...................... 377/47; 327/115; 327/117; 377/48
(58) Field of Classification Search ........ 327/113–117, 327/119; 377/47, 48
See application file for complete search history.

(56) References Cited

U.S. PATENT DOCUMENTS

| 5,425,074 | A | * | 6/1995 | Wong ........................ 377/47 |
| 6,768,353 | B2 | | 7/2004 | Carralero et al. ........... 327/115 |
| 6,970,025 | B2 | * | 11/2005 | Magoon et al. ............. 327/115 |
| 7,113,009 | B2 | * | 9/2006 | Sun et al. ................... 327/115 |
| 2005/0253630 | A1 | * | 11/2005 | Huang et al. ............... 327/115 |

* cited by examiner

*Primary Examiner*—Linh My Nguyen
*Assistant Examiner*—Colleen O'Toole

(57) ABSTRACT

Disclosed is an apparatus for multiple-divisor prescaler, which includes an odd/even core divider, a divisor control logic unit, an odd number inserted mechanism, and an n-order divided-by-2 divider with changeable trigger edges. This invention uses a clock toggle mechanism to vary the trigger edges of each divided-by-2 divider in the n-order divider, and associates the odd/even core divider to realize the multiple-divisor prescaler apparatus. Thereby, it achieves the purpose of being divided by 30/31. In addition, it increases the divisor range up to $2^{n-1}+2$ and $2^n+1$ through the use of the clock toggle mechanism.

20 Claims, 10 Drawing Sheets

APPARATUS FOR MULTIPLE-DIVISOR PRESCALER

FIELD OF THE INVENTION

The present invention generally relates to a wireless communication system and device, and more specifically to a multiple-divisor prescaler apparatus using changeable trigger edges.

BACKGROUND OF THE INVENTION

The prescaler is an important component for frequency configuration in the wireless communication systems, devices and applications. The prescaler provides multi-modulus divide ratio for the system to achieve wide operating frequency range to meet the flexible needs of the modern wireless communication systems.

However, the increasing higher transmission frequency limits the operating speed of the prescaler and increases the power consumption. U.S. Pat. No. 6,768,353 disclosed a prescaler device. The prescaler device provides the easily controlled multi-modulus divide ratio that can operate under 1 GHz and consumes only a little power. FIG. 1 shows a schematic view of a block diagram of the prescaler device.

As shown in FIG. 1, a prescaler device 100 includes a frequency divider 101, a plurality of series-coupled delay elements 111-11N, and a plurality of transmission gates 120-12N. Frequency divider 101 includes an input node 101a, and a divider output 101b. Frequency divider 101 is coupled with a clock signal and has a pre-determined divisor. Delay elements 111-11N are coupled with the divider output 101b and the clock signal. Each of the transmission gates 120-12N is coupled between the input node 101a and the delayed output of a corresponding delay element.

When a transmission gate is enabled and the delayed output of the m-th delay element is outputted to input node 101a, the output frequency of the divider of frequency divider 101 is equal to a clock frequency. The clock frequency is the one that is divided by the pre-determined divisor then plus m. In other words, the prescaler in FIG. 1 uses the delay to increase divisor, and executes $2^n+m$.

In designing the radio frequency (RF) phase-locked loop (PLL) for digital broadcasting, a prescaler divided by 30/31 must be included to achieve the frequency configuration of the system. However, this type of divisor cannot be efficiently implemented with the aforementioned simple prescaler. Therefore, the implementation of such a prescaler divided by 30/31 remains a challenge.

SUMMARY OF THE INVENTION

The present invention has been made to overcome the above-mentioned drawback of conventional prescaler device. The primary object of the present invention is to provide a multiple-divisor prescaler apparatus using changeable trigger edges. The present invention includes a logic structure of changing the trigger edges of each order of divided-by-2 divider, and uses an odd/even core divider to realize the multiple-divisor prescaler to execute the 30/31 division. Also, the present invention increases the division range to $2^{n-1}+2 \sim 2^n+1$.

The multiple-divisor prescaler includes an odd/even core divider, a divisor control logic unit, an odd number inserted mechanism, and an n-order divided-by-2 divider with changeable trigger edges.

The odd/even core divider includes an input clock and generates a divider output.

The n-order divided-by-2 divider with changeable trigger edges includes a cascade of n divided-by-2 dividers with changeable trigger edge. Each order of divided-by-2 divider with changeable trigger edge receives the output signal from the previous order and generates an output signal for divisor control logic unit and odd number inserted mechanism, respectively.

The divisor control logic unit includes a trigger edge changing mechanism for generating signal for each divided-by-2 divider of the n-order divided-by-2 divider that requires changing the trigger edge and generating two or more auxiliary signals for the odd number inserted mechanism according to the input divisor instruction bits and the output signals of the n-order divided-by-2 divider.

The odd number inserted mechanism receives the two or more auxiliary signals from the divisor control logic unit and performs combinational logic operation with the output signals from each order divided-by-2 divider with changeable trigger edge to determine the time slot for the odd/even core divider when executing the division by an odd number.

The multiple-divisor prescaler uses the trigger edge changing mechanism and the odd/even core divider to increase the division range to $2^{n-1}+2 \sim 2^n+1$, and the number of the divisor is determined by the input control signal fed to the divisor control logic unit.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
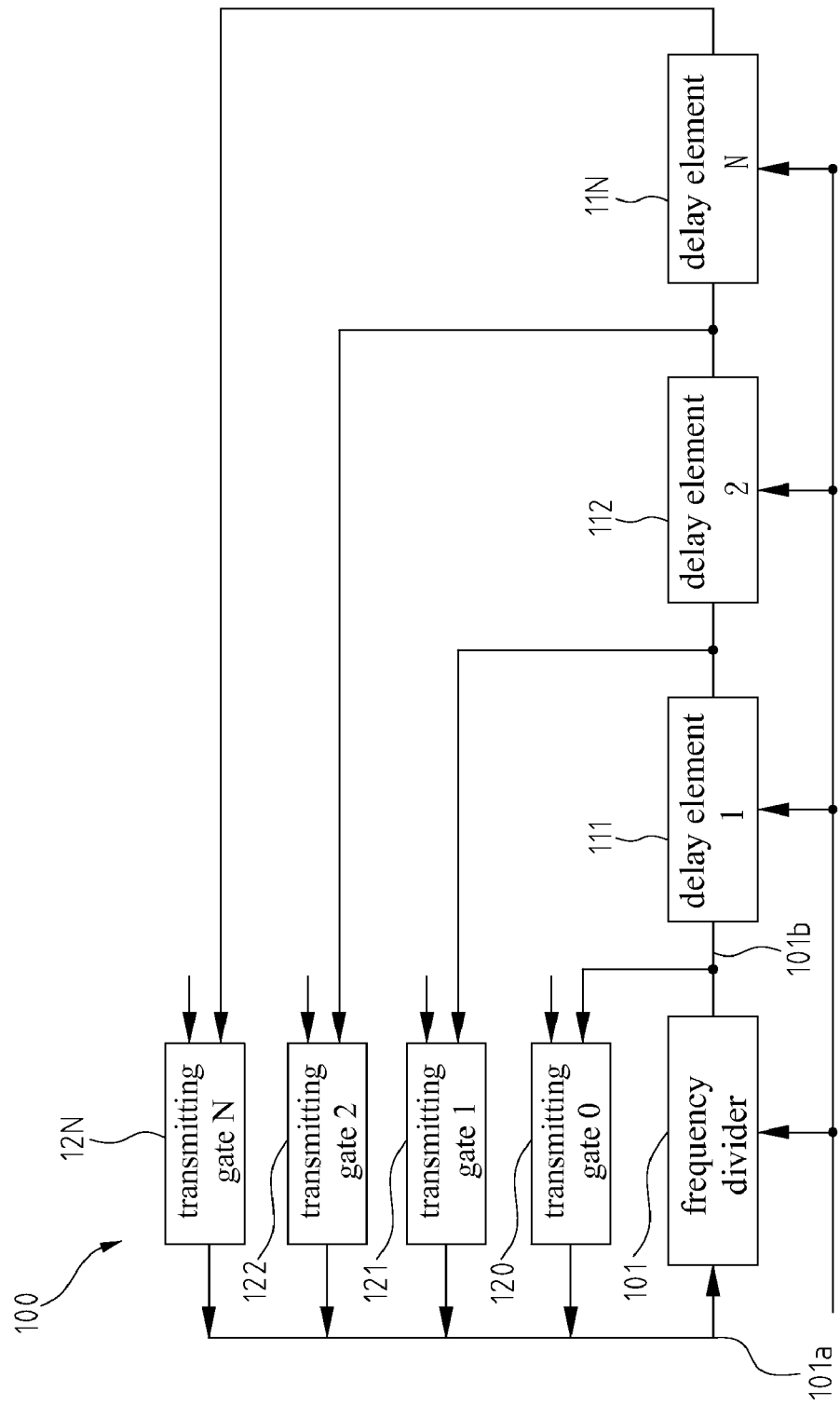
FIG. 1 shows a schematic view of a conventional prescaler.
Figure 2A:
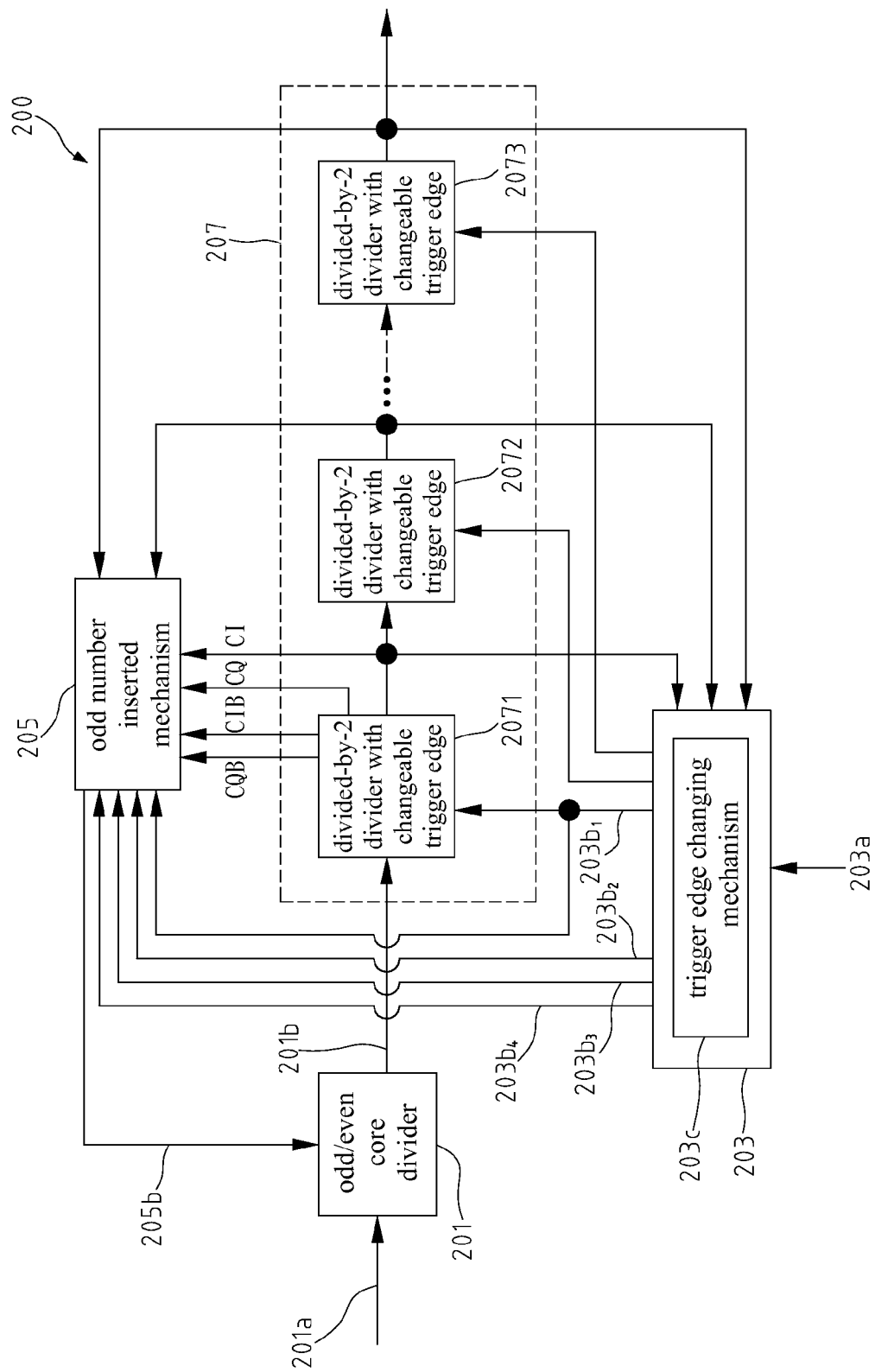
FIG. 2A shows a schematic view of an electrical block diagram of the present invention.

FIG. 2A shows a schematic view of an electrical block diagram of an embodiment of the present invention. As shown in FIG. 2A, a multiple-divisor prescaler 200 includes an odd/even core divider 201, a divisor control logic unit 203, an odd number inserted mechanism 205, and an n-order divided-by-2 divider 207 with changeable trigger edges, where n is an integer greater than 1. The n-order divided-by-2 divider 207 with changeable trigger edges includes a cascade of n divided-by-2 dividers 2071-207n with changeable trigger edges. The divisor control logic unit 203 includes a trigger edge changing mechanism 203c for changing the trigger edges of all the divided-by-2 dividers 2071-207n.

The odd/even core divider 201 includes an input clock 201a, and generates a divider output 201b. The divisor control logic unit 203 receives a divisor instruction 203a, generates signals for the divided-by-2 divider 2071-207n of n-order divided-by-2 divider 207 that requires changing trigger edges, and generates a first auxiliary signal $203b_1$, a second auxiliary signal $203b_2$, a third auxiliary signal $203b_3$, and a fourth auxiliary signal $203b_4$ for odd number inserted mechanism 205.

The first order divided-by-2 divider 2071 with changeable trigger edge provides four phase output signals CQB, CIB, CQ and CI to the odd number inserted mechanism 205. The odd number inserted mechanism 205 receives the first auxiliary signal $203b_1$, the second auxiliary signal $203b_2$, the third auxiliary signal $203b_3$, and the fourth auxiliary signal $203b_4$ from divisor control logic unit 203, and performs combinational logic operation with the outputs from the divided-by-2 dividers 2071-207n with changeable trigger edges to determine the time slot for the odd/even core divider 201 to be divided by an odd number.

In the embodiment of FIG. 2A, CI is an in-phase control signal, CQ is a quadrature control signal, CIB is the inverse signal of the CI, and CQB is the inverse signal of CQ. When the first auxiliary signal $203b_1$ from the divisor control logic unit 203 equals to 1, the third auxiliary signal $203b_3$ and the fourth auxiliary signal $203b_4$ are used to select one phase control signal from the four phase control signals CQB, CIB, CQ, and CI.

The multiple-divisor prescaler 200 uses the trigger edge changing mechanism 203c of the divisor control logic unit 203 and the odd/even core divider 201 to increase the division range to $2^{n-1}+2 \sim 2^n+1$. The number of the divisors is determined by the input control signal 203a of the divisor control logic unit 203.

Figure 2B:
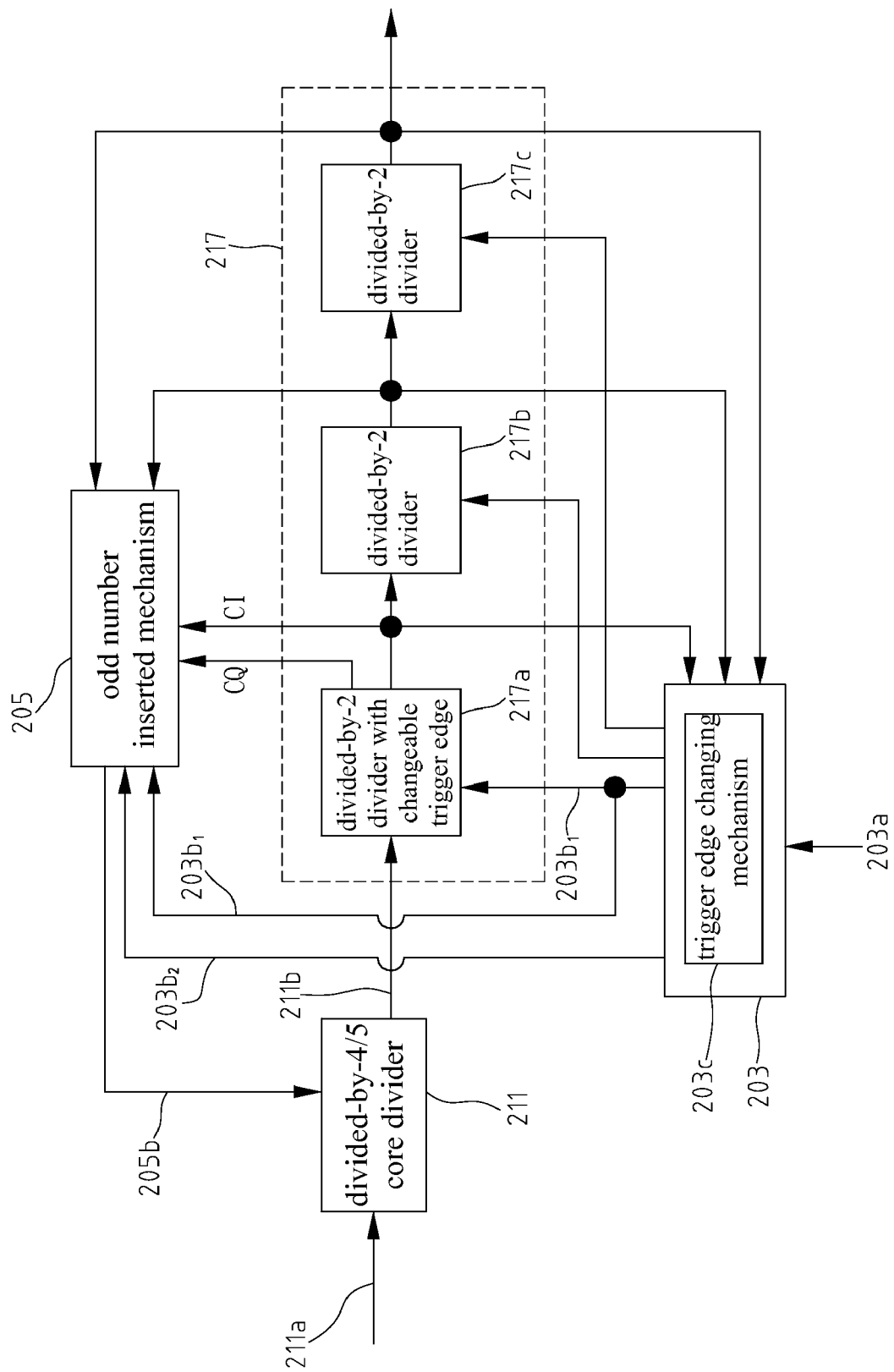
FIG. 2B shows a simplified electrical block diagram of FIG. 2A.

Without loss of generality, FIG. 2B is a simplified embodiment of FIG. 2A. As shown in FIG. 2B, the odd/even core divider 201 uses a 4/5 core divider 211 as an embodiment, and n-order divided-by-2 divider 207 with changeable trigger edges uses a 3-order divided-by-2 divider 217 with changeable trigger edges as an embodiment to explain the structure of FIG. 2A used in the division by 30/31. The following describes the operation of the elements in the multiple-divisor prescaler.

The 4/5 core divider 211 includes an input clock 211a, and generates a divider output signal 211b. It is worth noticing that FIG. 2B is for 30/31 division; therefore, 3-order divided-by-2 divider 217 with changeable trigger edges includes a cascade of a first-order divided-by-2 divider 217a with changeable trigger edge and a second-order divided-by-2 divider 217b and a third-order divided-by-2 divider 217c, which do not require the change of trigger edges. Each of the dividers 217a-217c receives an output signal from the previous order and generates its own output signal to provide to the divisor control logic unit 203 and the odd number inserted mechanism 205.

Because only the first-order divided-by-2 divider 217a requires changing the trigger edge in the 30/31 division embodiment, the divisor control logic unit 203 only generates a trigger edge determining signal $203b_1$ to the first-order divider 217a of the 3-order divided-by-2 divider 217 with changeable trigger edge after receiving the divisor instruction bit 203a. In addition, in the 30/31 division embodiment, the first-order divided-by-2 divider 217a with changeable trigger edge only requires providing in phase control signal CI and quarature control signal CQ, and the divisor control logic unit 203 only requires providing two auxiliary signals. The signal $203b_1$ is provided to odd number inserted mechanism 205 for selecting either the in-phase control signal or the quarature signal of the first-order divided-by-2 divider 217a with changeable trigger edge. Another auxiliary signal $203b_2$ from the divisor control logic unit 203 is provided to odd number inserted mechanism 205 for determining whether divided by an even or an odd number. The first-order divided-by-2 divider 217a with changeable trigger edge receives the output signal 211b from the 4/5 core divider 211 and generates control signals CI and CQ to provide to odd number inserted mechanism 205. The in-phase control signal CI is also transmitted to the second-order divided-by-2 divider 217b.

The odd number inserted mechanism 205 receives two auxiliary control signals from the divisor control logic unit 203, $203b_1$ and $203b_2$, and performs combinational logic operation with the output signals of the divider of each order to determine a time slot 205b for being divided by 5 to provide to the 4/5 core divider 211.

Figure 3:
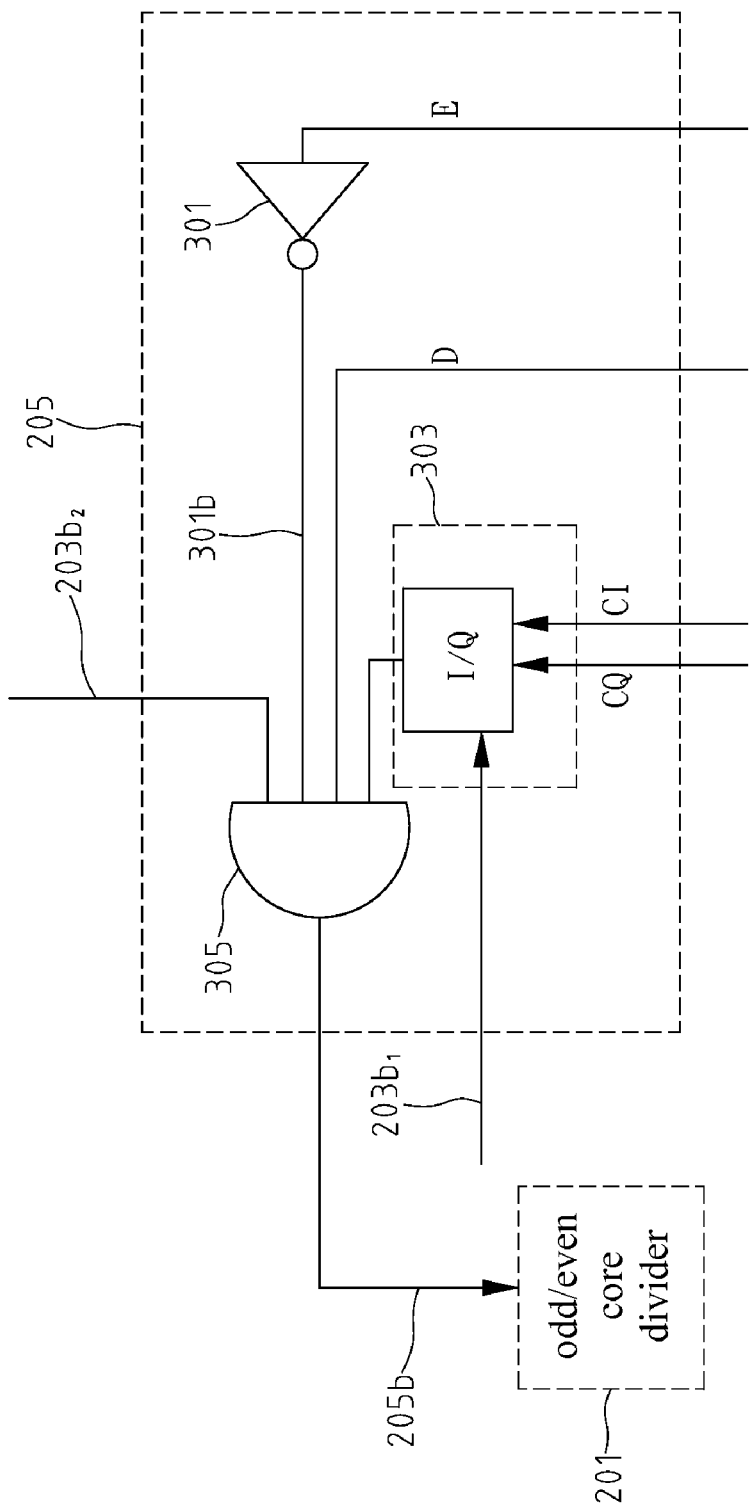
FIG. 3 shows a schematic view of an electrical block diagram of the application of the odd number inserted mechanism to 30/31 according to the present invention.

FIG. 3 shows a schematic view of an electrical block diagram of the odd number inserted mechanism used in the 30/31 embodiment. As shown in FIG. 3, the odd number inserted mechanism 205 includes an inverter 301, a phase signal selector 303 and an AND gate 305. The inverter 301 receives an output signal E from the last-order divided-by-2 divider with changeable trigger edge, changes the polarity of the signal, and outputs a signal 301b to the AND gate 305. The operating cycle of the odd number inserted mechanism 205 is determined by the combinational logic of all the output signals, such as D and E, of all the divided-by-2 dividers with changeable trigger edges, the phase selection signal $203b_1$ and the odd number hint signal $203b_2$. The phase signal selector 303 receives the control signals CI and CQ from the first-order divided-by-2 divider with changeable trigger edge, selects either CI or CQ in accordance with the signal $203b_2$ from the divisor control logic unit 203, and outputs to the AND gate 305 to determine a time slot for being divided by 5.

Figure 4:
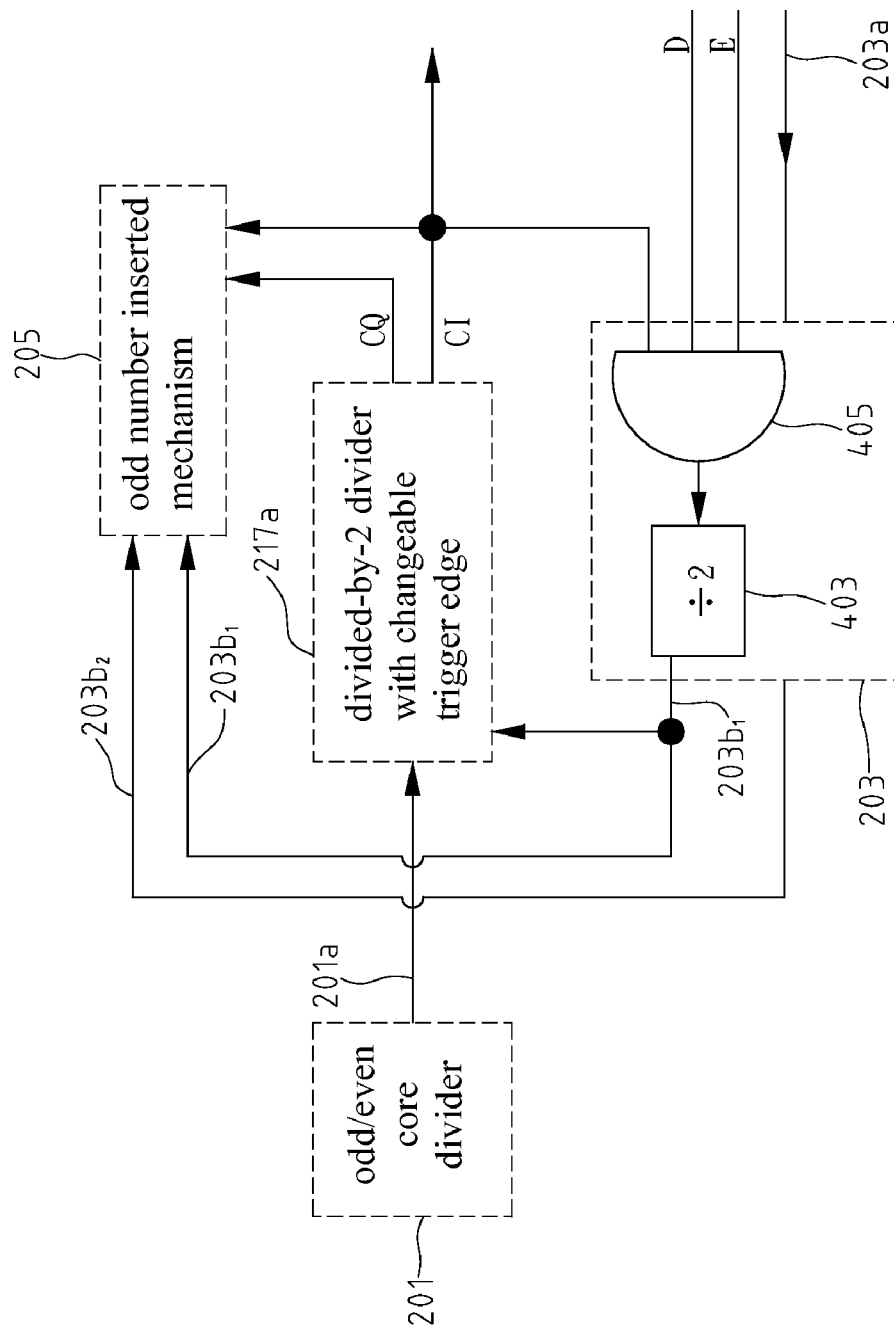
FIG. 4 shows a schematic view of an electrical block diagram of the application of the divisor control logic unit to 30/31 according to the present invention.

FIG. 4 shows a schematic view of an electrical block diagram of the divisor control logic unit used in the 30/31 embodiment. As shown in FIG. 4, the divisor control logic unit 203 includes a divided-by-2 divider 403, and an AND gate 405. A divided-by-2 divider 403 determines the time slot for changing the trigger edge of the divided-by-2 dividers with changeable trigger edge. The output signal $203b_1$ is fed to the first-order divided-by-2 divider 217a with changeable trigger edge, and is also provided to the odd number inserted mechanism 205 to select either CI or CQ signal of the first-order divided-by-2 divider.

In the 30/31 embodiment, the divisor instruction 203a includes two control bits. The first control bit is set to be 1, that is, setting the divisor to be less than $2^5$. The second control bit determines whether to be divided by an odd or even number. In this embodiment, the second control bit is directly fed to the output of the divisor control logic unit 203 to become the odd number hint signal $203b_2$. The first control bit is used by the AND gate 405 to intersect with the outputs from all the divided-by-2 dividers. The generated result from the AND gate 405 is outputted to the divided-by-2 divider 403.

It is worth noticing that the input to the AND gate 405 depends on the divisor. Therefore, when used in the general structure divided by a divisor in the range $2^{n-1}+2 \sim 2^n+1$ in FIG. 2A, the first control bit selects the output from the divided-by-2 dividers in 207 for AND operation at the AND gate 405, and generates the result for outputting to the divided-by-2 divider 403. FIGS. 6A-6D show the timing sequences of different divisors, which will be explained later.

The following mathematic expressions can be used to explain how the trigger edge changing mechanism of the multiple-divisor prescaler of the present invention increases the range of the divisor d to $2^{n-1}+2$~$2^n+1$. First, the binary representation of the divisor d is:

$$d = 2^n - \sum_{i=1}^{n-2} a_i 2^i + b, \ a_i = 0, 1, b = 0, 1; \ \sum_{i=1}^{n-2} a_i 2^i \leq 2^{n-1} - 2.$$

The control logic for changing the trigger edges is as follows. When $a_i \neq 0$, the i-th order divided-by-2 divider with changeable trigger edge changes to execute the state switching on another trigger edge after the changing trigger edge instruction is issued.

Figure 5:
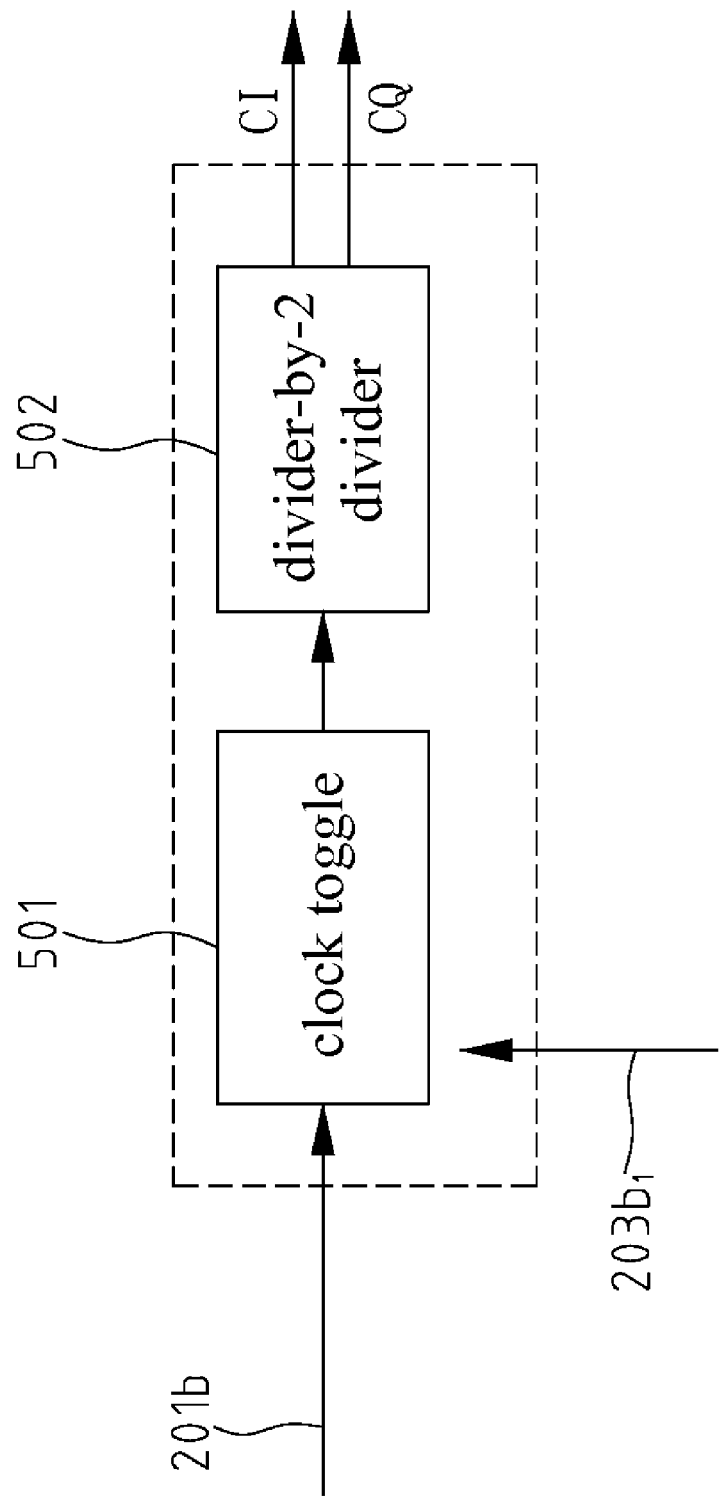
FIG. 5 shows a schematic view of an electrical block diagram of a divided-by-2 divider with changeable trigger edge according to the present invention.

FIG. 5 is a schematic view of an electrical block diagram of a divided-by-2 divider with changeable trigger edge. As shown in FIG. 5, a divided-by-2 divider with changeable trigger edge includes a cascade of a clock toggle 501 and a divided-by-2 divider 502. When the input clock is toggled, the divided-by-2 divider is triggered by another trigger edge of the previous order divider.

FIGS. 6A-6D show the time sequence of the pulse state transition when divided by 18, 22, 28, and 30, respectively. The B in the FIGS. 6A-6D represents the output signal $201b$ from the odd/even core divider of FIG. 2A. The B' represents the output signal from a clock toggle 501 of the first-order divided-by-2 divider with changeable trigger edge. The C' represents the output signal from the clock toggle 501 of the second-order divided-by-2 divider with changeable trigger edge. The D' represents the output signal from the clock toggle 501 of the third-order divided-by-2 divider with changeable trigger edge.

Figure 6A:
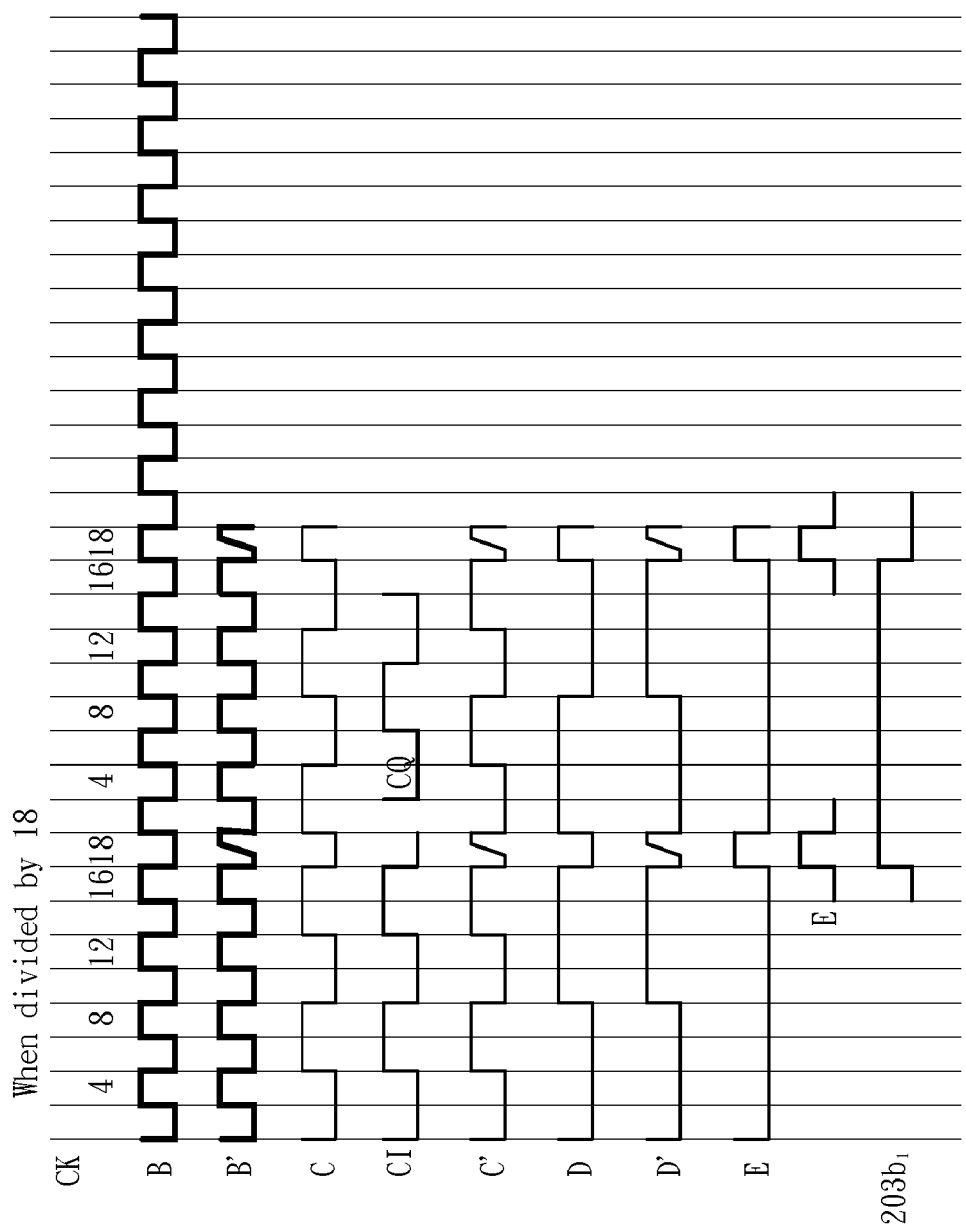
FIGS. 6A-6D show the time sequence of the pulse state transition when divided by 18, 22, 28, and 30, respectively.

As shown in FIG. 6A, when divided by 18, the first-order, second-order and third-order divided-by-2 dividers all must execute the change of switching trigger edges because $18=32-2^3-2^2-2^1$. The divisor logic control unit feeds the output signal E from the third-order divided-by-2 divider directly to the divided-by-2 divider 403 for execution, and the result is fed again to the first-order, second-order, and third-order divided-by-2 dividers. Thereby, when the first-order, second-order, and third-order divided-by-2 dividers execute the division by 2, the dividers use the new state changing edges of the output from each previous stage of them as the trigger edges, as the 0→1 in B, C, and D FIG. 6A during the period that the signal $203b_1$ is high. In this manner, the first-order divided-by-2 divider will count only half of the divisor (4) represented by the previous order when its trigger edge is changed at the first time, the second-order divided-by-2 divider will count only half of the divisor (8) represented by the previous order when its trigger edge is changed at the first time, and the third-order divided-by-2 divider will count only half of the divisor (16) represented by the previous order when its trigger edge is changed at the first time. In total, 14 less clock signals are inputted to the odd/even core divider. To perform the division by 19, the result of CI∩D∩EB is selected as the time slot for odd number insertion when the output signal of the divided-by-2 divider 403 is 0, and the result of CQB∩D∩EB is selected as the time slot for odd number insertion when the output signal of the divided-by-2 divider 403 is 1.

Figure 6B:
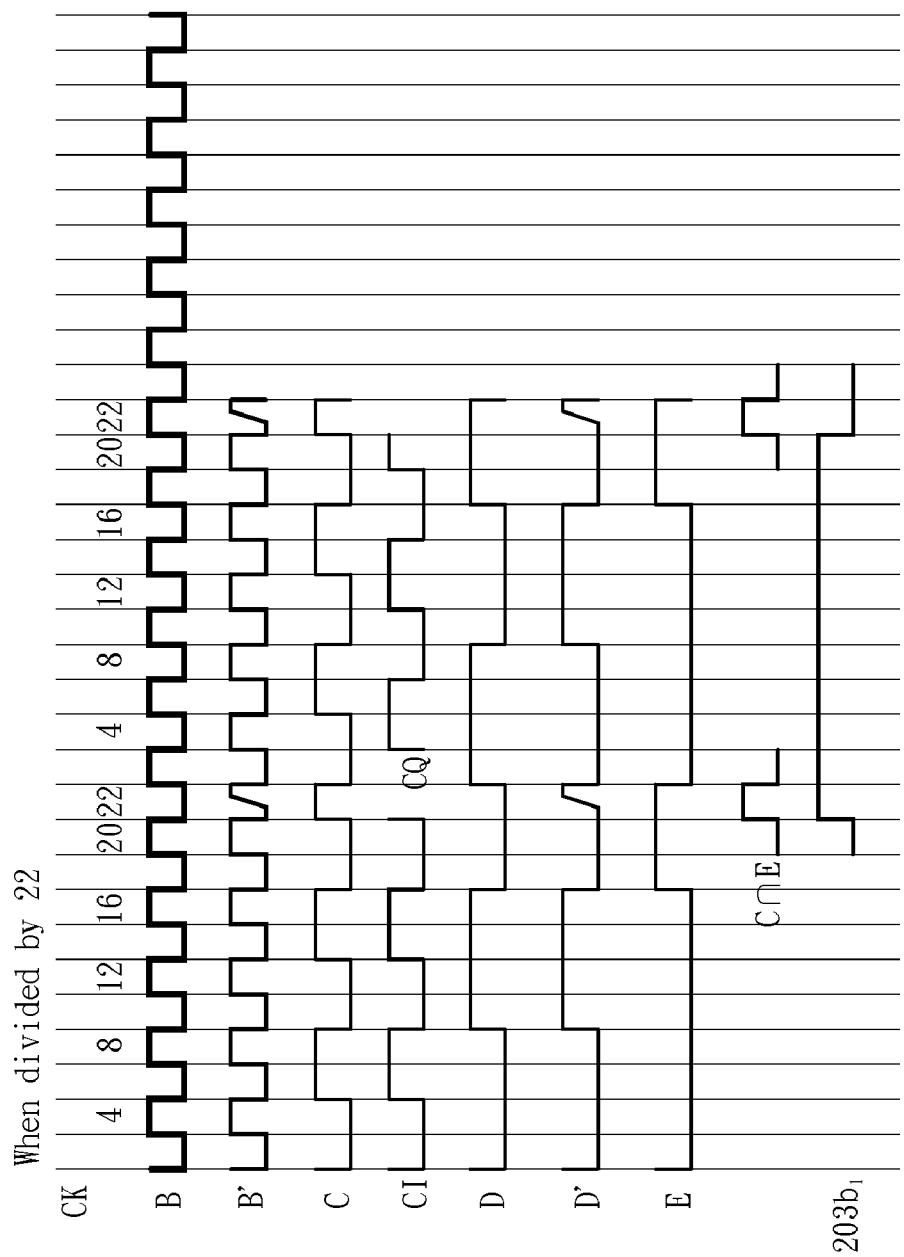

As shown in FIG. 6B, when divided by 22, the first-order, and third-order divided-by-2 dividers both must execute the change of switching trigger edges because $22=32-2^3-2^1$. The divisor logic control unit intersects the output signal E from the third-order divided-by-2 divider and the output signal C from the first-order divided-by-2 divider, and feeds the result directly to the divided-by-2 divider 403 for execution, and the result is fed again to the first-order, and third-order divided-by-2 dividers. Thereby, when the first-order, and third-order divided-by-2 dividers execute the division by 2, the dividers use the new state changing edges of the output from each previous stage of them as the trigger edges, as the 0→1 in B and D in FIG. 6B during the period that the signal $203b_1$ is high. In this manner, the first-order divided-by-2 divider will count only half of the divisor (4) represented by the previous order when its trigger edge is changed at the first time, and the third-order divided-by-2 divider will count only half of the divisor (16) represented by the previous order when its trigger edge is changed at the first time. In total, 10 less clock signals are inputted to the odd/even core divider. To perform the division by 23, the result of CI∩D∩EB is selected as the time slot for odd number insertion when the output signal of the divided-by-2 divider 403 is 0, and the result of CQ∩D∩EB is selected as the time slot for odd number insertion when the output signal of the divided-by-2 divider 403 is 1.

Figure 6C:
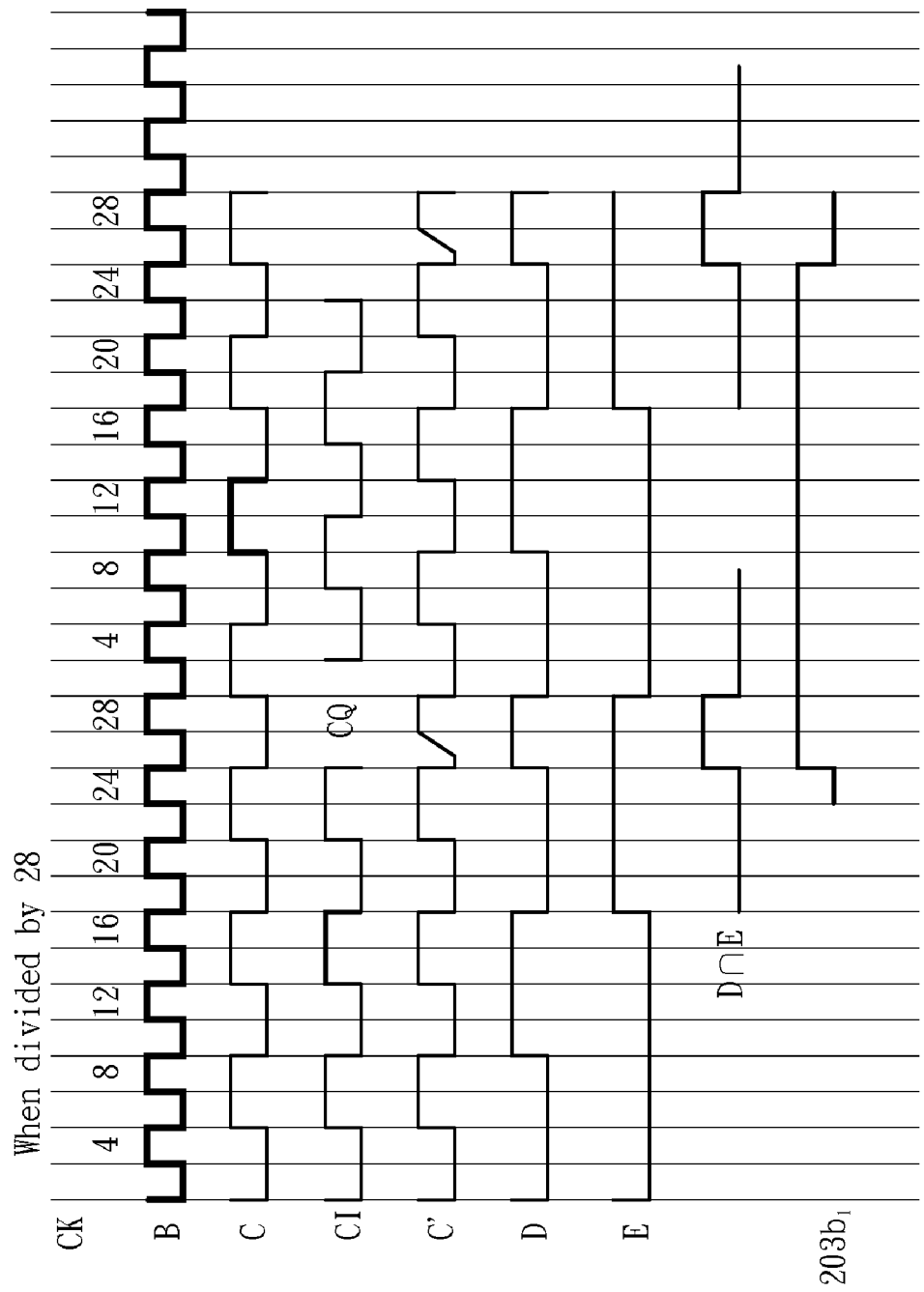

As shown in FIG. 6C, when divided by 28, the second-order divided-by-2 divider must execute the change of switching trigger edges because $28=32-2^2$. The divisor logic control unit intersects the output signal E from the third-order divided-by-2 divider with the output signal D from second-order divided-by-2 divider, feeds the result directly to the divided-by-2 divider 403 for execution, and the result is fed again to the second-order divided-by-2 divider. Thereby, when the second-order divided-by-2 divider execute the division by 2, the divider use the new state changing edge of the output from its previous stage as the trigger edge, as the 0→1 in C in FIG. 6C during the period that the signal $203b_1$ is high. In this manner, the second-order divided-by-2 divider will count only half of the divisor (8) represented by the previous order when its trigger edge is changed at the first time. In total, 4 less clock signals are input to the odd/even core divider. To perform the division by 29, the result of CI∩D∩EB is selected as the time slot for odd number insertion when the output signal of the divided-by-2 divider 403 is 0, and the result of CIB∩D∩EB is selected as the time slot for odd number insertion when the output signal of the divided-by-2 divider 403 is 1.

Figure 6D:
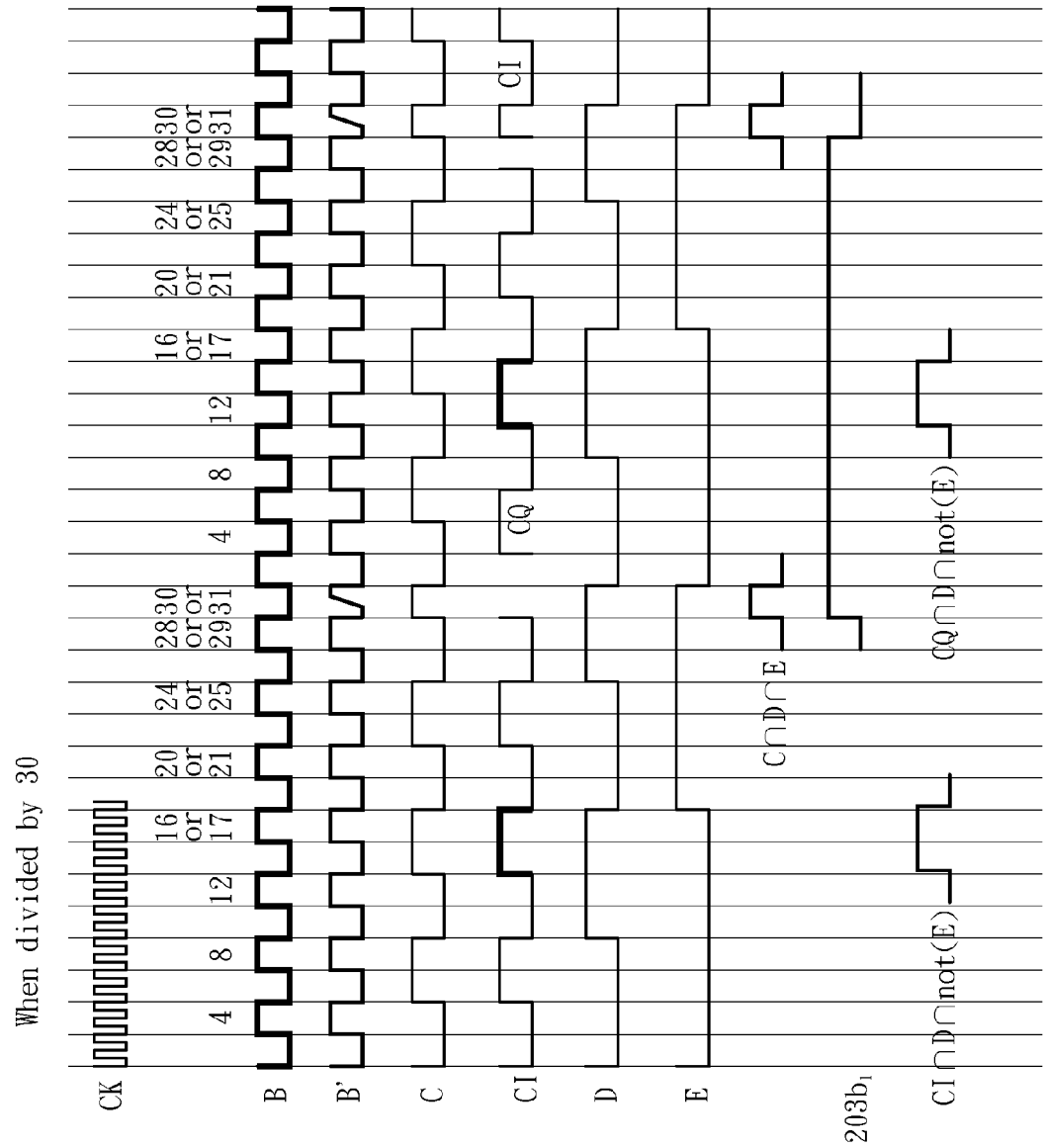

As shown in FIG. 6D, when divided by 30, the first-order divided-by-2 divider must execute the change of switching trigger edges because $30=32-2^1$. The divisor logic control unit intersects the output signal E from the third-order divided-by-2 divider with the output signal D from the second-order divided-by-2 divider and the output signal C from the first-order divided-by-2 divider, feeds the result directly to the divided-by-2 divider 403 for execution, and the result is fed again to the first-order divided-by-2 divider. Thereby, when the first-order divided-by-2 divider execute the division by 2, the divider use the new state changing edge of the output from its previous stage as the trigger edge, as the 0→1 in B in FIG. 6D during the period that the signal $203b_1$ is high. In this manner, the first-order divided-by-2 divider will count only half of the divisor (4) represented by the previous order when its trigger edge is changed at the first time. In total, 2 less clock signals are input to the odd/even core divider. To perform the division by 31, the result of CI∩D∩EB is selected as the time slot for odd number insertion when the output signal of the divided-by-2 divider 403 is 0, and he result of CQ∩D∩EB is selected as the time slot for odd number insertion when the output signal of the divided-by-2 divider 403 is 1.

In summary, an apparatus for multiple-divisor prescaler is provided, including an odd/even core divider, a divisor control logic unit, an odd number inserted mechanism, and an n-order divided-by-2 divider with changeable trigger edges. This invention uses a clock toggle mechanism to vary the trigger edges for the output of each divided-by-2 divider in the n-order divider, and associates the odd/even core divider to realize the multiple-divisor prescaler apparatus. Thereby, it achieves the purpose of being divided by 30/31. In addition, it increases the division range up to $2^{n-1}+2$ and $2^n+1$ through the use of the clock toggle mechanism.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An apparatus for multiple-divisor prescaler, comprising:
    an odd/even core divider, having an input clock and generating an divider output;
    an n-order divided-by-2 divider with changeable trigger edge, further including a cascade of n divided-by-2 dividers, called first-order, second-order, . . . , nth-order divided-by-2 divider, respectively, each said order divider receiving an output signal from previous said order divider, and generating an output signal, n being greater than 1;
    a divisor control logic unit, for receiving an input divisor instruction, generating a signal to each said order divided-by-2 divider of said n-order divided-by-2 divider with changeable trigger edge requiring changing trigger edge, and generating a plurality of auxiliary signals; and
    an odd number inserted mechanism, for receiving two or more auxiliary signals, and performing combinational logic operation with said output signals from each said order divided-by-2 divider to determine a time slot for division by odd number and provide to said odd/even core divider.

2. The apparatus as claimed in claim 1, wherein said apparatus is a divided-by-30/31 prescaler.

3. The apparatus as claimed in claim 1, wherein said divisor control logic unit generates four auxiliary signals, and said first-order divided-by-2 divider generates four phase control signals for providing to said odd number inserted mechanism.

4. The apparatus as claimed in claim 1, wherein said odd/even core divider is a divided-by-4/5 core divider.

5. The apparatus as claimed in claim 1, wherein n is equal to 3.

6. The apparatus as claimed in claim 2, wherein said divisor control logic unit generates two said auxiliary signals, with one being an odd number hint signal, and the other being a phase selection signal, and said first-order divided-by-2 divider generates an in-phase control signal and a quarature control signal for providing to said odd number inserted mechanism.

7. The apparatus as claimed in claim 6, wherein said odd number inserted mechanism further includes:
    an inverter that receives said output signal from said nth-order divided-by-2 divider, changes the polarity of said signal and outputs said inverted signal;
    a phase signal selector that receives said in phase control signal and said quarature control signal, and selects one of said control signals for output according to said phase selection signal; and
    an AND gate that performs combinational logic operation on said odd number hint signal, said output signal from said phase signal selector and said inverted signal to determine said time slot for division by an odd number.

8. The apparatus as claimed in claim 1, wherein said divisor control logic unit further includes:
    a divided-by-2 divider that determines the changing time for trigger edge of said divided-by-2 divider with changeable trigger edge, and feeds its output to said first-order divided-by-2 divider and said odd number inserted mechanism; and
    an AND gate that receives one or more control bits of said input divisor instruction, selects one or more said output signals from said divided-by-2 divider for intersection, and outputs the result of said intersection to said divided-by-2 divider.

9. The apparatus as claimed in claim 1, wherein the number of said divisors is controlled by said input divisor instruction.

10. The apparatus as claimed in claim 1, wherein each said order divided-by-2 divider includes a cascade of a clock toggle and a divided-by-2 divider.

11. The apparatus as claimed in claim 1, wherein said divisor control logic unit includes a trigger edge changing mechanism for changing trigger edge of each said order divided-by-2 divider to use binary representation for divisor d and execute control logic of changing trigger edge.

12. The apparatus as claimed in claim 11, wherein said divisor d is expressed as:

$$d = 2^n - \sum_{i=1}^{n-2} a_i 2^i + b, \ a_i = 0, 1, b = 0, 1$$

$$\sum_{i=1}^{n-2} a_i 2^i \leq 2^{n-1} - 2$$

when $a_i \neq 0$, the i-th order divided-by-2 divider changes to execute the state switching on the other trigger edge after the changing trigger edge instruction is issued.

13. An apparatus for multiple-divisor prescaler, comprising:
    an odd/even core divider, having an input clock and generating an divider output;
    a divisor control logic unit, further including a trigger edge changing mechanism, for receiving an input divisor instruction and generating a plurality of auxiliary signals;
    an n-order divided-by-2 divider with changeable trigger edge, further including a cascade of n divided-by-2 dividers, called first-order, second-order, . . . , nth-order divided-by-2 divider, respectively, each said order divider receiving said an output signal from previous said order divider, and generating an output signal, n being greater than 1; and an odd number inserted mechanism, for receiving two or more auxiliary signals, and performing combinational logic operation with said output signals from each said order divided-by-2 divider to determine a time slot for division by odd number to said odd/even core divider;

wherein said apparatus uses said trigger edge changing mechanism and said odd/even core divider to increase the division range to $2^{n-1}+2 \sim 2^n+1$.

14. The apparatus as claimed in claim 13, wherein said odd/even core divider is a divided-by-4/5 core divider and n is 3.

15. The apparatus as claimed in claim 13, wherein said apparatus is a divided-by-30/31 prescaler.

16. The apparatus as claimed in claim 13, wherein each said order divided-by-2 divider includes a cascade of a clock toggle and a divided-by-2 divider.

17. The apparatus as claimed in claim 13, wherein said divisor control logic unit generates two said auxiliary signals, with one being an odd number hint signal, and the other being a phase selection signal.

18. The apparatus as claimed in claim 13, wherein said divisor d is expressed as:

$$d = 2^n - \sum_{i=1}^{n-2} a_i 2^i + b, a_i = 0, 1, b = 0, 1$$

$$\sum_{i=1}^{n-2} a_i 2^i \leq 2^{n-1} - 2$$

when $a_i \neq 0$, the i-th order divided-by-2 divider changes to execute the state switching on the other trigger edge after the changing trigger edge instruction is issued.

19. The apparatus as claimed in claim 13, wherein said divisor control logic unit further includes:

a divided-by-2 divider that determines the changing time for trigger edge of said divided-by-2 divider with changeable trigger edge, with output being fed to said first-order divided-by-2 divider and said odd number inserted mechanism; and an AND gate that receives one or more control bits of said input divisor instruction, selects one or more said output signals from said divided-by-2 divider for intersection, and outputs result to said divided-by-2 divider.

20. The apparatus as claimed in claim 17, wherein said odd number inserted mechanism further includes:

an inverter that receives said output signal from said nth-order divided-by-2 divider, changes the polarity of said signal and outputs said inverted signal;

a phase signal selector that receives said in phase control signal and said quarature control signal, and selects one of said control signals for output according to said phase selection signal; and an AND gate that performs combinational logic operation on said odd number hint signal, said output signal from said phase signal selector and said inverted signal to determine said time slot for division by an odd number.

* * * * *